(12) United States Patent
Retz et al.

(10) Patent No.: US 9,523,467 B2
(45) Date of Patent: Dec. 20, 2016

(54) OVER-PRESSURE LIMITING ARRANGEMENT FOR A CRYOGEN VESSEL

(71) Applicant: SIEMENS PLC, Frimley, Camberley (GB)

(72) Inventors: Patrick William Retz, Oxfordshire (GB); Neil Charles Tigwell, Oxfordshire (GB)

(73) Assignee: Siemens PLC, Camberley (GB)

( * ) Notice: Subject to any disclaimer, the term of this patent is extended or adjusted under 35 U.S.C. 154(b) by 292 days.

(21) Appl. No.: 14/382,071

(22) PCT Filed: Jan. 29, 2013

(86) PCT No.: PCT/EP2013/051644
§ 371 (c)(1),
(2) Date: Aug. 29, 2014

(87) PCT Pub. No.: WO2013/127586
PCT Pub. Date: Sep. 6, 2013

(65) Prior Publication Data
US 2015/0027559 A1 Jan. 29, 2015

(30) Foreign Application Priority Data
Feb. 29, 2012 (GB) .................................. 1203526.7

(51) Int. Cl.
*F16K 17/14* (2006.01)
*F17C 13/12* (2006.01)
(Continued)

(52) U.S. Cl.
CPC ............... *F17C 13/12* (2013.01); *F16K 17/16* (2013.01); *G01R 33/288* (2013.01);
(Continued)

(58) Field of Classification Search
CPC ............ F17C 13/12; F16K 17/16; H01F 6/02; G01R 33/288; G01R 33/3804; G01R 33/3815; Y10T 137/1692; Y10T 137/1714; Y10T 137/2605; Y10T 137/2615; Y10T 137/2622; Y10T 137/2627
(Continued)

(56) References Cited

U.S. PATENT DOCUMENTS 4,655,045 A  4/1987 Matsumoto et al.
5,265,430 A * 11/1993 Chen ..................... F17C 13/007
                                                    62/48.1
(Continued)

FOREIGN PATENT DOCUMENTS

DE  2822587 A1  11/1979
EP  0375656 A2  6/1990
(Continued)

*Primary Examiner* — Craig Schneider
*Assistant Examiner* — Minh Le
(74) *Attorney, Agent, or Firm* — Schiff Hardin LLP (57) ABSTRACT

An over-pressure limiting arrangement for a cryogen vessel includes an access neck providing access into the cryogen vessel, a tubular structure extending through the access neck, a turret outer assembly joined leak-tight to the cryogen vessel and defining an interior volume that is separated from the atmosphere by a protective valve or burst disc, enclosing an upper extremity of the access neck and the tubular structure. An egress path defines a route for cryogen gas to escape from the turret outer assembly, and a pressure-responsive quench valve seals the egress path and opens when a differential pressure between the interior of the turret outer assembly and the interior of the egress path exceeds a predetermined value. An auxiliary burst disc, or a valve, is attached to the tubular structure within the turret outer assembly, with an inner surface thereof exposed to the (Continued)

interior of the tubular structure and an outer surface thereof exposed to the interior of the turret outer assembly.

19 Claims, 5 Drawing Sheets

(51) Int. Cl.
| | |
|---|---|
| *F16K 17/16* | (2006.01) |
| *H01F 6/02* | (2006.01) |
| *G01R 33/28* | (2006.01) |
| *G01R 33/38* | (2006.01) |
| *G01R 33/3815* | (2006.01) |

(52) U.S. Cl.
CPC ........... *G01R 33/3804* (2013.01); *H01F 6/02* (2013.01); *G01R 33/3815* (2013.01); *Y10T 137/1692* (2015.04)

(58) Field of Classification Search
USPC ................. 137/68.19, 68.23, 613, 115.13, 115.15, 137/115.18, 115.2; 62/51.1, 48.1
See application file for complete search history.

(56) References Cited

U.S. PATENT DOCUMENTS

| | | | | |
|---|---|---|---|---|
| 5,291,739 A * | 3/1994 | Woods | ............... | H01F 6/02 220/745 |
| 5,339,650 A * | 8/1994 | Hakamada | ............... | F17C 3/085 62/47.1 |
| 5,442,927 A * | 8/1995 | Germain | ............... | F01K 25/08 62/50.2 |
| 5,586,437 A * | 12/1996 | Blecher | ............... | F25B 9/00 62/47.1 |
| 6,109,042 A * | 8/2000 | Woods | ............... | F17C 13/12 62/51.1 |
| 6,505,469 B1 * | 1/2003 | Drube | ............... | F17C 7/04 62/48.1 |
| 6,604,541 B1 * | 8/2003 | Denning | ............... | F16K 17/162 137/492.5 |
| 7,004,188 B2 * | 2/2006 | Zikeli | ............... | F16K 17/16 137/340 |
| 7,581,405 B2 * | 9/2009 | Higginbotham | ............... | F17C 1/00 62/47.1 |
| 7,665,312 B2 * | 2/2010 | Jonas | ............... | F25D 19/006 324/318 |
| 8,525,023 B2 * | 9/2013 | Tigwell | ............... | G01R 33/3804 174/15.4 |
| 8,650,889 B2 * | 2/2014 | Hempstead | ............... | H01F 6/04 62/48.1 |
| 8,820,347 B2 * | 9/2014 | Mann | ............... | F25D 3/10 137/486 |
| 8,978,685 B2 * | 3/2015 | Newman | ............... | F16K 17/40 137/540 |
| 2004/0194473 A1 * | 10/2004 | Daniels | ............... | F17C 3/085 62/6 |
| 2004/0239462 A1 * | 12/2004 | Nemoto | ............... | H01F 6/065 335/216 |
| 2005/0204751 A1 | 9/2005 | White et al. | | |
| 2007/0103320 A1 | 5/2007 | Bittner | | |
| 2009/0107151 A1 * | 4/2009 | Clayton | ............... | F17C 3/085 62/48.3 |
| 2009/0205721 A1 | 8/2009 | Husband et al. | | |
| 2010/0051307 A1 | 3/2010 | Tigwell et al. | | |
| 2011/0036101 A1 | 2/2011 | Tigwell et al. | | |
| 2013/0232997 A1 * | 9/2013 | Gustafson | ............... | F17C 7/04 62/48.1 |
| 2015/0267827 A1 * | 9/2015 | Harris | ............... | F16K 31/1223 137/68.22 |
| 2015/0276129 A1 * | 10/2015 | Retz | ............... | H01F 6/04 62/51.1 |

FOREIGN PATENT DOCUMENTS

| | | |
|---|---|---|
| GB | 2457488 A | 8/2009 |
| GB | 2462626 A | 2/2010 |
| GB | 2468491 | 9/2010 |
| GB | 2472589 A | 2/2011 |
| JP | S5645004 | 4/1981 |
| JP | S5764908 | 4/1982 |
| JP | 2007167229 A | 7/2007 |
| JP | 2009082308 | 4/2009 |
| WO | WO 03044424 A2 | 5/2003 |

* cited by examiner

OVER-PRESSURE LIMITING ARRANGEMENT FOR A CRYOGEN VESSEL

BACKGROUND OF THE INVENTION

Field of the Invention

The present application relates to safety pressure limiting features on cryogen vessels, particularly in respect of cryogen vessels containing superconducting magnets of magnetic resonance imaging (MRI) systems. In particular, it relates to the advantageous arrangement of components of an auxiliary vent path, provided to limit pressure within the cryogen vessel in case of a quench of the superconducting magnet.

Description of the Prior Art

Figure 1:
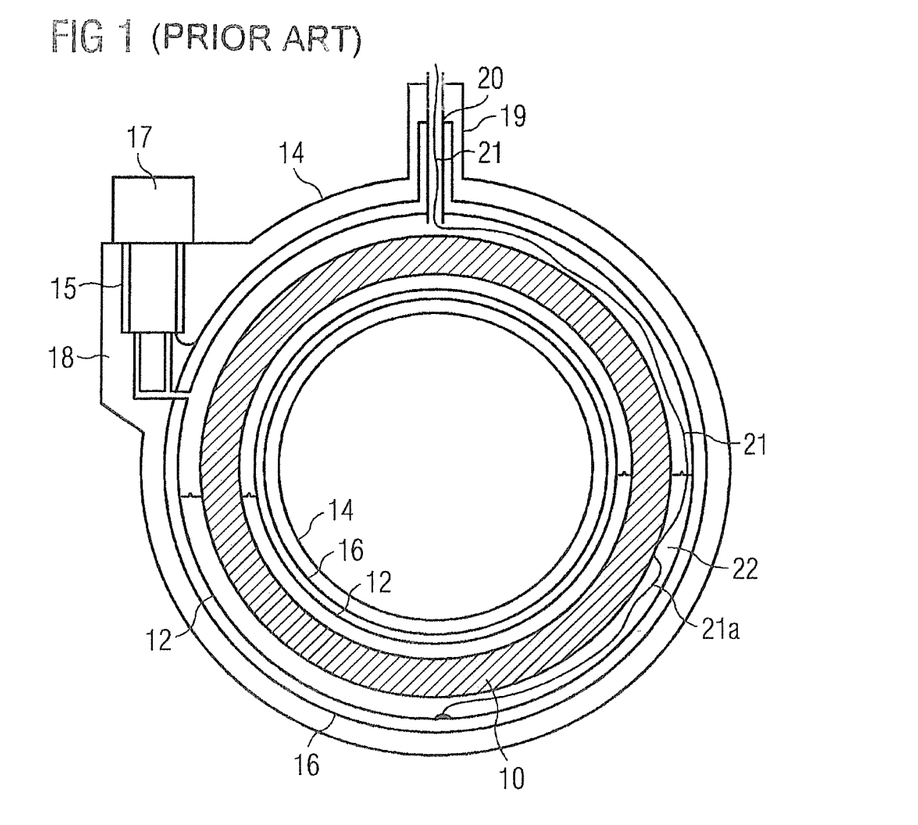
FIG. 1 shows a conventional cryostat arrangement housing a superconducting magnet.

FIG. 1 shows a conventional arrangement of a cooled superconducting magnet 10 within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator may be located within an access turret 19, which retains access neck (vent tube) 20 mounted at the top of the cryostat. The refrigerator provides active refrigeration to cool cryogen gas, typically helium, within the cryogen vessel 12, in some arrangements by recondensing it into a liquid 22. The refrigerator may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

A negative electrical connection 21a is usually provided to the magnet 10 through the body of the cryostat. A positive electrical connection 21 is usually provided by a conductor passing through the vent tube 20.

For fixed current lead (FCL) designs, a separate vent path (auxiliary vent) (not shown in FIG. 1) is provided as a fail-safe vent in case of blockage of the vent tube 20. It is this auxiliary vent path which is the subject of the present invention.

Figure 2:
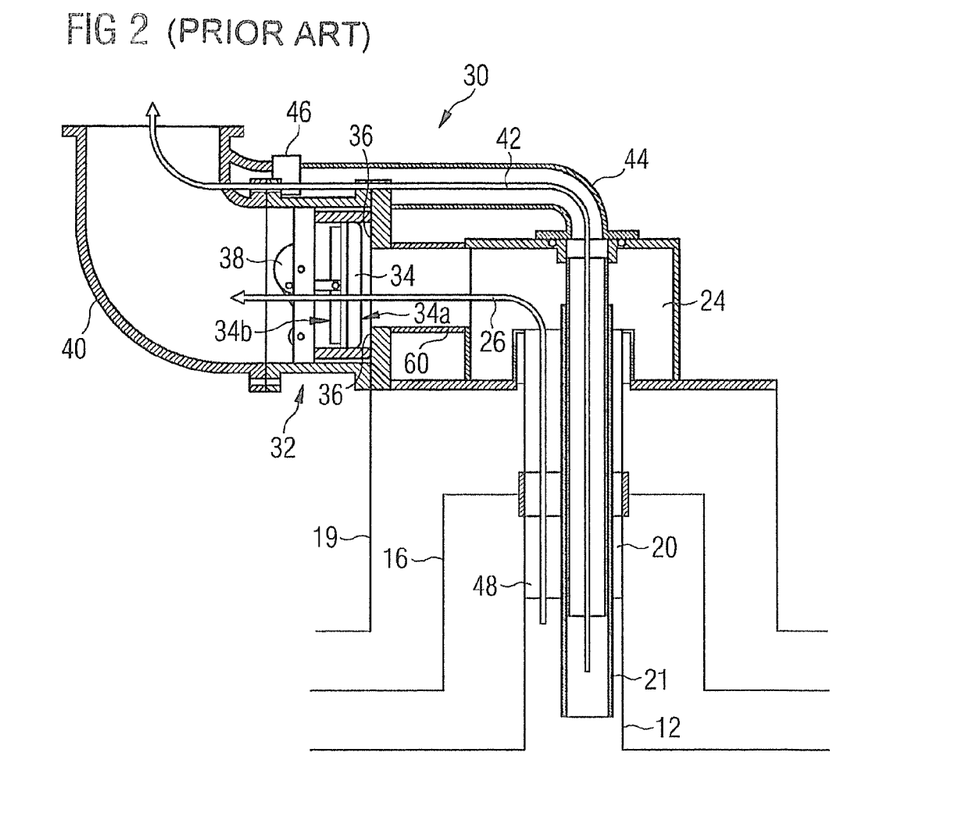
FIG. 2 shows a conventional over-pressure limiting arrangement.

FIG. 2 shows an example of a conventional over-pressure limiting protection arrangement 30, designed to vent cryogen gas from the cryogen vessel in case of over-pressure, such as could occur following a quench of the magnet.

A superconducting magnet 10 is contained within a cryogen vessel 12 as discussed with reference to FIG. 1. A turret outer assembly 24 encloses upper extremities of access neck (vent tube) 20 and positive current lead 21, and provides a normal exit path 26 for cryogen gas from cryogen vessel 12. Turret outer assembly 24 is joined to the cryogen vessel in a leak-tight manner and defines an interior volume which is separated from atmosphere by a protective valve and/or burst disc, and forms part of normal exit path 26. The protective valve and/or burst disc in the illustrated example is quench valve 32.

In the event of a quench, the cryogen vessel 12 is vented to atmosphere via the vent tube 20 in the access turret 19 through the interior volume of the turret outer assembly 24 and quench valve 32. Quench valve 32 includes a valve plate 34 which is held against valve seat 36 by a spring arrangement 38. Cryogen egress tube 40 leads exit path 26 to atmosphere, or to a cryogen recuperation facility, essentially at atmospheric temperature. In case of over-pressure within cryogen vessel 12, a corresponding pressure of cryogen gas within the turret outer assembly 24 acting on the inner side 34a of the valve plate 34 will exceed the pressure acting on the outer side 34b of the valve plate sufficiently to overcome the force of the spring arrangement 38 and open the valve 32. Cryogen gases will escape, maintaining the pressure within the cryogen vessel at an acceptable level. Once the pressure in the cryogen vessel and the interior volume of the turret outer assembly 24 drops below the pressure needed to keep the quench valve 32 open, spring 38 will press the valve plate 34 back into contact with valve seat 36.

Part of the valve plate 34 may be formed by a burst disc, not visible in the drawing as it lies in the plane of the valve plate 34. In case the differential pressure across the valve plate becomes much higher than the pressure at which the quench valve 32 should open, for example if the quench valve 32 sticks, or the pressure increase within the cryogen vessel is extremely rapid or severe, the burst disc will rupture and cryogen gas will then escape through a hole left by the burst disc and out of the cryogen vessel 12 through the interior volume of the turret outer assembly 24 and egress tube 40. This burst disc is typically a declared regulatory pressure relief safety device, provided to rupture in the event of quench valve failure.

In addition to the declared safety device, an auxiliary vent path 42 is provided, through a tubular positive current lead 21 to atmosphere via an external room-temperature tube 44 fitted with its own auxiliary burst disc 46. Auxiliary vent path 42 does not pass through the interior volume of the turret outer assembly 24. The auxiliary burst disc 46 is designed to rupture when a differential pressure across it meets a certain value, in excess of the differential pressure at which quench valve 32 is designed to open, and in excess of the differential pressure at which the bust disc within valve plate 34 is designed rupture.

It is known that air ingress into the access neck 20 may cause ice to form in region 48, between the inner wall of the access neck 20 and the positive current lead 21. If sufficient ice forms in this region, it may form a constriction, and cryogen gas may not be able to freely escape in case of a quench. A differential pressure may exist across the blockage, reducing the differential pressure across the quench valve 32.

On the other hand, the positive current lead 21 passes into the cryogen vessel more deeply than the ice-forming region 48, to the level of temperatures usually so cold that any air ingress into the access neck 20 freezes onto the access neck in region 48 and before it can reach the lower end of the positive current lead 21. The interior of the tubular positive current lead 21 may therefore be assumed to be free of ice. As there is no blockage in the positive current lead, the full differential pressure between the interior of the cryogen vessel 12 and atmospheric pressure in the egress tube 40 will apply across the auxiliary burst disc 46. Burst disc 46 is designed to rupture at a pressure high enough that it can only be reached if the quench valve 32 and its burst disc have failed to protect the cryogen vessel as designed.

Typically, quench valve 32 is designed to open in response to a 0.5 BAR (50 kPa) differential pressure between the high pressure side 34a exposed to the interior volume of the turret outer assembly 24 and the low pressure side 34b exposed to the interior of the egress tube 40. The burst disc within the quench valve is typically designed to rupture in response to a differential pressure of 1.4 BAR (140 kPa), and the auxiliary burst disc 46 is typically designed to rupture in response to a differential pressure of 1.8 BAR (180 kPa). These values are chosen to protect the cryogen vessel in all circumstances, but are sufficiently separated that the quench valve 32 will open without damage to the burst disc within the quench valve unless the quench valve is stuck, and that the auxiliary burst disc 46 will only rupture in response to a cryogen vessel pressure so high that it is clear that neither the quench valve 32 nor the burst disc within the quench valve are going to open.

This arrangement has certain drawbacks, which the present invention seeks to alleviate.

In present arrangements such as shown in FIG. 2, the auxiliary burst disc 46 is permanently subjected to the full differential pressure between the interior volume of the turret outer assembly 24 and the cryogen vessel on one side and the egress path 40, which is at approximately atmospheric pressure, on the other side. This differential pressure may approach the pressure at which the auxiliary burst disc 46 is designed to rupture.

During a quench event which is vented through the auxiliary burst disc 46, the pressure within the cryogen vessel may approach the maximum allowable working pressure of the cryogen vessel, due to the constriction of escaping gas in the "room-temperature" tube 44 and the rapid expansion of this cryogen gas due to heating as it passes through the "room temperature" tube 44. It would be preferable from this point of view to provide a room temperature tube 44 of increased cross-section, but this would have the undesired effect of increasing the height of the overall system.

In the event of rupture of the auxiliary burst disc 46, air can be drawn back into the auxiliary vent path 42 once the over-pressure within the cryogen vessel has ceased. This can cause a buildup of ice within the tubular positive current lead 21 which is difficult to detect or remove.

A further disadvantage is the cost of the external room-temperature pipe work 44 and seals required to interface the auxiliary vent path 42 to the remainder of the equipment. The external pipe work 44 adds to overall system height, which causes integration problems in siting the cryostat. Any external joints, seals, welds etc. all have the potential to cause leaks into the vent path during normal service, and so their number should preferably be reduced.

SUMMARY OF THE INVENTION

The present invention addresses these, and further, problems by relocating the auxiliary burst disc to the tubular positive current lead 21, preferably to the top of the tubular positive current lead 21 within the turret outer assembly 24. In the event of the normal exit path 26 becoming blocked or restricted, cryogen gas escapes via the tubular positive current lead to atmosphere via the turret outer assembly and through the quench valve or burst disc.

UK patent GB2472589 proposes a single vent path in a similar application.

DESCRIPTION OF THE PREFERRED EMBODIMENTS

Figure 3:
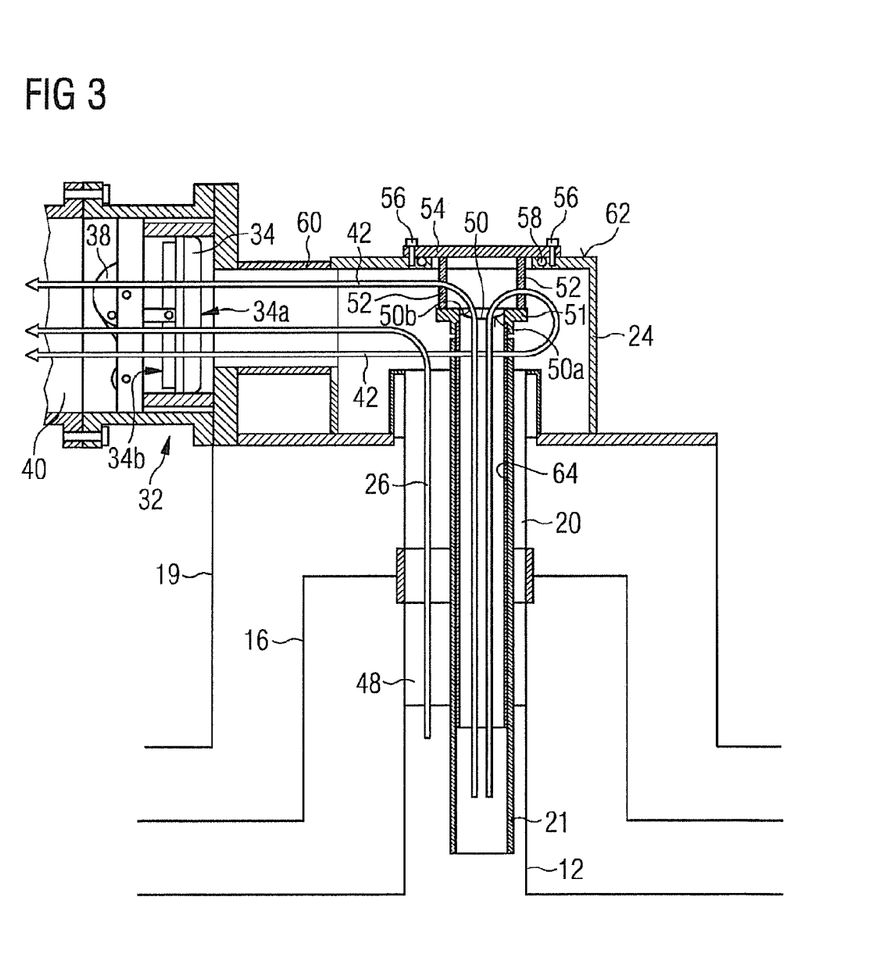
FIG. 3 shows an over-pressure limiting arrangement according to an embodiment of the present invention.

As shown in FIG. 3, an over-pressure limiting arrangement according to an embodiment of the present invention comprises an auxiliary burst disc 50 placed at or near the upper extremity of the tubular positive current lead 21, within the turret outer assembly 24. The inner surface 50a of the auxiliary burst disc 50 is exposed to the interior of the tubular positive current lead 21, and thence to the interior of the cryogen vessel 12. The outer surface 50b of the auxiliary burst disc 50 is exposed to the interior of the turret outer assembly 24. The auxiliary burst disc may be mounted onto a carrier 51 which is mounted by pillars 52 onto a removable cover plate 54, which may be fastened by bolts 56 and sealed by o-ring 58 to the turret outer assembly 24.

As for the conventional arrangement of FIG. 2, the normal exit path 26 in the arrangement of FIG. 3 is through access neck 20, turret outer assembly 24 and through quench valve 32. However, according to the present invention, the auxiliary vent path 42 is also through the turret outer assembly 24 and through quench valve 32. Escaping cryogen gas may flow through auxiliary burst disc 50 and between pillars 52 which surround the auxiliary burst disc 50 and mount the carrier 51 onto a removable cover plate 54, as shown.

Provided that normal exit path 26 is not blocked, over-pressure within the cryogen vessel will cause increased differential pressure between inner 34a and outer 34b sides of the valve element 34 of quench valve 32. Once that differential pressure becomes sufficient to overcome the force applied by the spring 38, the quench valve 32 will open and release cryogen gas from the interior volume of the turret outer assembly 24 into the egress tube 40, to reduce the pressure in the cryogen vessel. Once a sufficient amount of cryogen gas has escaped to reduce the pressure within the cryogen vessel to a normal level, the force applied by spring 38 is sufficient to close the quench valve 32.

In the event of the normal exit path 26 becoming blocked or restricted, typically by a build-up of ice in region 48 between the inner wall of access neck 20 and tubular positive current lead 21, pressure within the cryogen vessel will build up until the differential pressure between inner 50a and outer 50b sides of auxiliary burst disc 50 is sufficient to cause the auxiliary burst disc to rupture. Cryogen gas then escapes through the tubular positive current lead 21 to atmosphere via the turret outer assembly 24 and through the quench valve 32. Unlike with the conventional auxiliary burst disc arrangement of FIG. 2, the auxiliary vent path 42 closes once a sufficient amount of cryogen gas has escaped to reduce the pressure within the cryogen vessel to a normal level, and the force applied by spring 38 is sufficient to close the quench valve 32.

In such an arrangement of the present invention, the auxiliary burst disc 50 may be designed to rupture at a relatively low differential pressure. This will occur if sufficient pressure differential exists between the cryogen vessel 12 and the turret outer assembly 24, which will only occur if some blockage is present in the normal egress path 26. The auxiliary burst disc may be designed to open at a differential pressure of 0.5 bar (50 kPa), regardless of whether the quench valve 32 is open or closed. Quench valve 32 may be designed to open at a typical differential pressure of 0.5 BAR (50 kPa), so the auxiliary burst disc 50 should rupture in response to a 1 BAR (100 kPa) pressure difference between the cryogen vessel 12 and the egress path 40, assuming a total blockage of normal exit path 26 in the region 48. Due to the constrictions in the auxiliary vent path 42, the pressure in the cryogen vessel may rise during venting, but in this example is unlikely to exceed 1.4 BAR (1400 kPa) above the pressure in the egress tube 40, which is typically at atmospheric pressure.

In an alternative arrangement, the auxiliary burst disc 50 may be replaced by a valve. There are certain advantages that may be achieved in this way. The valve may have a lower opening pressure than the burst disc, and may be arranged to open during any quench, whether the gap between the access neck and the positive current lead 21 is clear or not, so as to share cryogen flow between normal exit path 26 and auxiliary vent path 42.

The valve should be arranged to re-seal after a quench, and would not require replacing each time it opened, which is the case for a burst disc. Some leakage of the valve may be acceptable, as there would be no leakage of cryogen to egress tube 40 under normal conditions, as quench valve 32 would remain closed. In its simplest form, a spring-loaded flap valve may be used. It may be preferred to include a burst disc within the valve, similar to the arrangement used with the quench valve 32, to ensure opening of the auxiliary vent path 42 even in case of the valve sticking closed. Removable cover plate 54 should still be provided, to allow for inspection and replacement of the valve.

The present invention provides auxiliary burst disc 50 or valve closing auxiliary vent path 42 in normal operation, and which opens into the turret outer assembly 24, upstream of the quench valve 32, when required.

The auxiliary quench path is accordingly protected by the declared regulatory pressure relief safety device, the burst disc in quench valve 32, in the same way as the normal egress path 26.

The differential pressure across the auxiliary burst disc 50 is greatly reduced, as compared to the differential pressure experienced by auxiliary burst disc 46 of conventional arrangements such as illustrated in FIG. 2, as the differential pressure across the auxiliary burst disc 50 is now the pressure differential between the cryogen vessel 12 and the interior of the turret outer assembly 24, rather than the pressure differential between the cryogen vessel 12 and atmosphere. This pressure differential is approximately halved, which means the rupture pressure of the burst disc can be correspondingly reduced. The pressure within the turret outer assembly 24 at the point of bursting of the auxiliary burst disc 50 may be predicted by conventional methods of Computational Fluid Dynamics, or may be measured by experimentation.

The present invention enables reliable operation of the auxiliary burst disc 50 and the auxiliary vent path 42 at a lower cryogen vessel pressure in the event of a quench through the auxiliary vent. In a normal steady-state situation, the differential pressure across the auxiliary burst disc 50 is zero, as pressure within the tubular positive current lead 21 will equalize with pressure within the turret outer assembly 24 by flow of cryogen gas through the normal exit path 26. This makes unwanted rupture of the auxiliary burst disc very unlikely. Auxiliary burst disc 50 will rupture only if a pressure differential exists between the cryogen vessel 12 and the volume enclosed by the turret outer assembly 24. This in turn will only occur if the normal exit path 26 is substantially blocked in the access turret 20, and either the pressure within the cryogen vessel has increased more rapidly than cryogen has been able to flow through normal exit path 26 to equalize with the pressure in the turret; or the quench valve 32 has at least partially opened, reducing the pressure within the turret outer assembly 24. Ice formation in region 48 may form a constriction, but is unlikely to completely block the normal exit path 26. In case of over-pressure within the cryogen vessel, some gas will flow through the constriction at 48 to partially open the quench valve 32. This partial opening of the quench valve will increase the differential pressure across the auxiliary burst disc 50 and cause it to rupture. Even with cryogen gas flowing through the normal exit path 26 and quench valve 32, the differential pressure across the auxiliary burst disc 50 will increase as the normal exit flow path becomes restricted due to ice build-up, typically in the region 48.

The auxiliary burst disc 50 is concealed within the turret outer assembly 24, and so is very unlikely to be mechanically damaged. In the conventional arrangement of FIG. 2, the outer casing of the auxiliary burst disc 46 is located at the very top of the cryostat, in a position which is exposed to possible mechanical damage during siting, or service operations.

The auxiliary burst disc 50 is in an air-free atmosphere, within the turret outer assembly 24, during normal service. The chances of any air ingress into the vent path 42 within the tubular positive current lead 19 are extremely low.

After venting of cryogen gas through a ruptured auxiliary burst disc 50, the chances of air ingress into the vent path 42 within the tubular positive current lead 19 are very low as the quench valve 32 re-seals the turret outer assembly 24 from atmosphere. It would only be possible for air ingress to reach beyond the ruptured auxiliary burst disc 50 if burst disc of the quench valve 32 is ruptured. Under these circumstances the air ingress would be shared between the normal 26 and the auxiliary 42 vent paths.

The cost of providing, fitting and maintaining the conventional external room-temperature pipework 44, with its seals etc. would be saved.

The height and installation complexity of the cryostat is reduced with the arrangement of the present invention.

In the case of a quench causing venting of cryogen gas through the auxiliary burst disc 46 of the conventional arrangement of FIG. 2, a significant proportion of the pressure drop between the cryogen vessel 12 and the egress tube 40 is in the constrictive room-temperature pipework 44, whose cross-section tends to be minimized to reduce the overall height of the system. In the arrangement of the present invention, the constrictive room-temperature pipework 44 is functionally replaced by the much larger cross-section of the turret outer assembly 24, quench pipe 60 and quench valve 32 or its burst disc.

The turret outer assembly 24 and quench valve 32 operate at room temperature so consequently remain ice free. There is no risk of the normal exit path 26 and the auxiliary vent path 42 from becoming obstructed due to a build-up of ice in the turret outer assembly 24 and quench valve 32. Even when cold during ramping and filling operations, no ice builds up in these regions.

Figure 4:
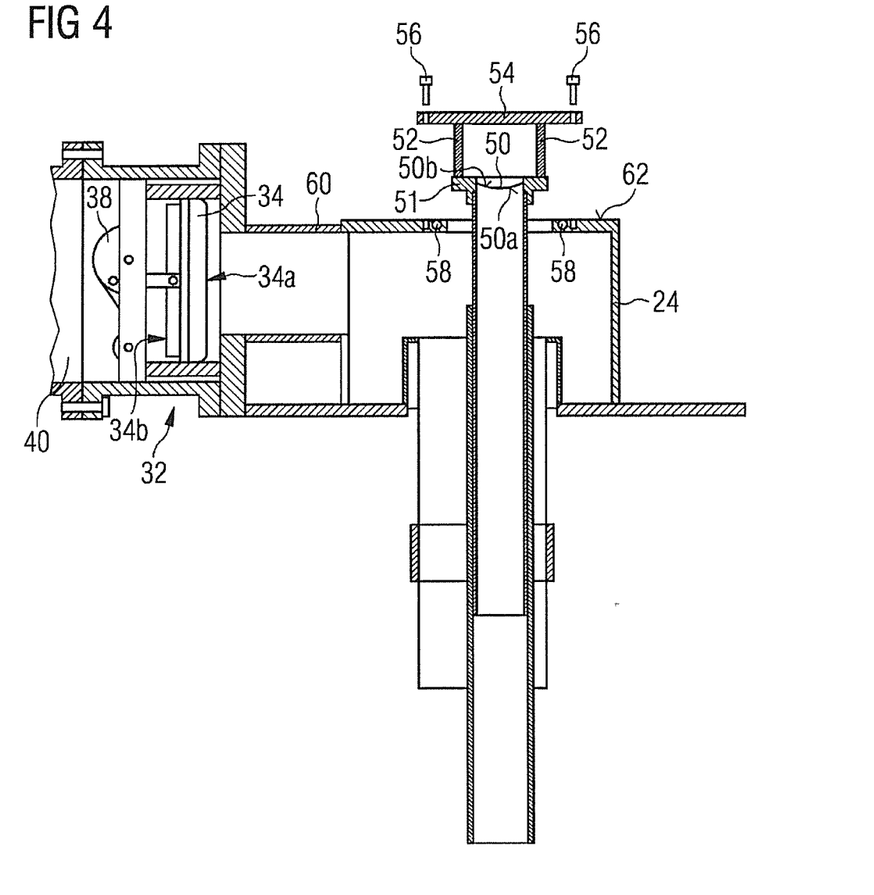
FIG. 4 shows a step in a servicing method for the over-pressure protection arrangement of FIG. 3.

Advantageously, the auxiliary burst disc 50 may be attached by pillars 52 to a plate 54 sealing a port in the service entry plate 62, part of the structure of the turret outer assembly 24. As illustrated in FIG. 4, such arrangement enables the auxiliary burst disc 50 to be removed easily for replacement, or to allow other service operations to be carried out.

As is conventional in itself, the auxiliary burst disc 50 could be fitted with electrical contacts to enable an alarm signal to be sent to the magnet supervisory system in the event of rupture of the auxiliary burst disc. This has the benefit of allowing remote diagnosis of disc rupture, enabling appropriate service action to be planned. In an example embodiment, the disc rupture sensing contacts could be wired in series with a refrigerator pressure sensor input, which may be arranged to switch off the refrigerator 17 in the event of auxiliary burst disc rupture. This would provide for a remote indication of auxiliary burst disc rupture without having to make any change to the magnet supervisory system. In addition, such an arrangement would reduce the chance of air ingress by turning off the refrigerator immediately and so allowing the cryogen vessel pressure to build up until a safety valve opens, which may be quench valve 32. Cryogen gas will flow out of the cryogen vessel at a rate determined by the thermal influx into the cryogen vessel, significantly reducing air ingress.

In an alternative embodiment, a sight glass could be fitted such that a visual inspection may be performed following a quench to determine whether the auxiliary burst disc 50 needs to be replaced. This is particularly simple in the case of arrangements such as shown in FIGS. 3-4, as a sight glass may be positioned in the cover plate 54, directly above the auxiliary burst disc 50.

During ramping of current into the magnet 10, liquid cryogen 22 is boiled off, and cold escaping cryogen gas cools the auxiliary burst disc 50. Similarly, the auxiliary burst disc 50 will be cooled when the cryogen vessel 12 is filled, or topped-up, with liquid cryogen 22. Due to the material properties of a typical burst disc, this cooling will raise the burst pressure of the burst disc by approximately 10-20%. In preferred embodiments of the present invention, the burst pressure of the auxiliary burst disc 50 may be substantially less than the burst pressure of the auxiliary burst disc 46 of the conventional arrangement, as explained above, and so the increase in burst pressure on cooling is proportionately lower. The position of the auxiliary burst disc 50 in the arrangement of the present invention also reduces the significance of the increase in burst pressure. Such temperature-dependent variation in burst pressure of burst discs is well understood among those skilled in the art, such variation may be compensated for during manufacture. The use of INCONEL® austenitic nickel-chromium-based superalloys for the disc material also reduces the effect by up to 50% as compared to other materials commonly used for burst discs, for example stainless steel.

As illustrated in FIG. 3, but more clearly visible in FIG. 4, a tube 64 could be bonded to the auxiliary burst disc 50 to prevent air ingress into the vent path through any gap between the auxiliary burst disc and the tubular positive current lead 21. When installed, the tube 64 passes inside the tubular positive current lead 21 to a depth beyond the expected depth of freezing of air components, illustrated by region 48 in FIG. 3. As illustrated, this may conveniently be achieved by bonding a tube 64 of fiberglass-reinforced plastic (GRP) onto carrier 51 which also carries the auxiliary burst disc 50. Alternatively, the burst disc carrier 51 could be sealed to the top of the tubular positive current lead. However, in any normal operational situation, the concentration of air in the turret outer assembly 24 would be already at a very low level, so the risk of significant air influx through a small leak may be considered minimal.

FIG. 4 shows the auxiliary burst disc being removed for replacement. As shown, it is a relatively simple matter to remove bolts 56 and withdraw cover plate 54, bringing auxiliary burst disc 50 on its carrier 51 with it. If necessary, the burst disc 50 may be replaced, but more conveniently, the burst disc carrier 51 may be replaced, carrying a new burst disc. Any tube 64 attached to the burst disc carrier 51 may be removed and attached to the replacement burst disc carrier 51. It may be preferred to simply replace the whole assembly of burst disc 50, burst disc carrier 51, pillars 52, cover plate 54 and any tube 64 when a service or replacement of burst disc is required.

Figure 5A:
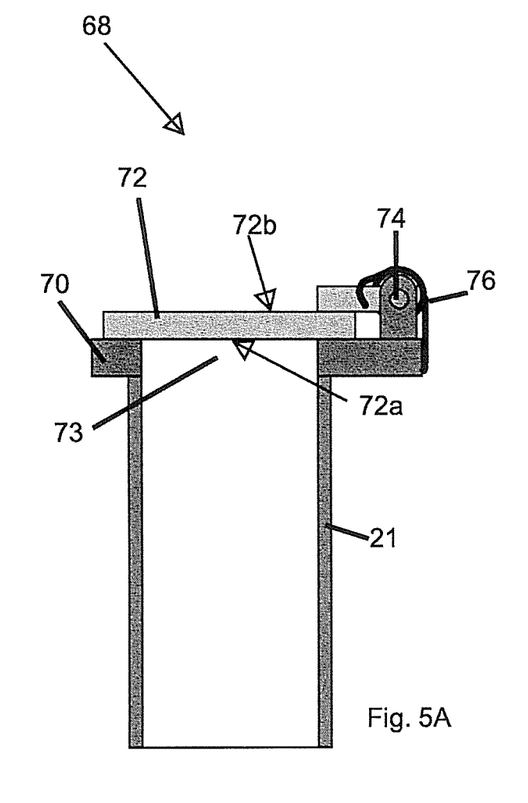
FIGS. 5A and 5B illustrate a valve which may be used in certain embodiments of the invention.
Figure 5B:
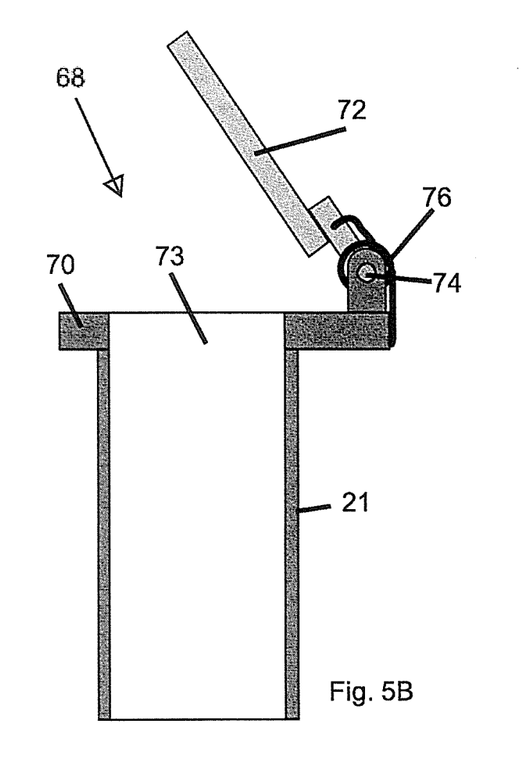

In an alternative series of embodiments, as illustrated in FIGS. 5A and 5B, the auxiliary burst disc 50 is replaced by a valve 68 attached to the upper end of the tubular positive current lead 21. Such valve may be of similar construction to the quench valve described, or may be any known type of safety valve suitable for carrying the desired flow rate of escaping cryogen. In FIG. 5A, a suitable spring-loaded flap valve 68 is shown closed, in cross-section, mounted at an upper extremity of the tubular positive current lead 21. An inner surface 72a of the valve is exposed to the interior of the tubular structure, and an outer surface 72b of the valve is exposed to the interior volume of the turret outer assembly (24).

FIG. 5B shows the same valve 68 open. The spring-loaded flap valve 68 includes a valve seat 70 mounted atop the tubular positive current lead 21. A valve flap 72 closes a through hole 73 in the valve seat. The valve flap is typically pivoted at a pivot 74, and is urged into its closed position by a coil spring 76. Such flap valves are common mechanical arrangements, but the materials chosen for the flap valve in the present invention must be suitable for operation at cryogenic temperatures. It may be preferred to mount such as valve atop a tube 64 such as illustrated in FIG. 4 to enable easy removal and replacement of the valve. However, by its nature, the valve 68 should not need to be replaced at every activation, and mounting direct to the tubular positive current lead 21 as shown in FIGS. 5A, 5B may be found sufficient.

Similar to the arrangement shown in FIGS. 3 and 4, the valve 68 may be mounted onto a carrier 51 which is itself mounted by pillars 52 onto a removable cover plate 54.

Types of valves other than the described flap valve may be used, as appropriate. In some arrangements, the valve may be located within the tubular positive current lead structure 21.

As such a valve would be situated in a cryogen-rich atmosphere within the turret outer assembly, the amount of air that could leak into the vent path may be regarded as insignificant. Also, this valve would preferably be self-closing, removing the need for inspection and replacement which is necessary where auxiliary burst discs 50 are used.

While the present invention has been described with reference to a limited number of specific embodiments, numerous variations will be apparent to those skilled in the art, within the scope of the appended claims. For example, the auxiliary burst disc 50, or a valve performing its function, need not be positioned at the top of the positive current lead 21, but may be positioned at any convenient position along the auxiliary vent path 42 between the lower end of the positive current lead 21 and the quench valve 32, such as inside the positive current lead 21. Although the present invention has described feature 21 as a "positive" current lead, this term is used in a descriptive, not limiting, manner reflecting present conventional electrical arrangements. The present invention may equally be applied to situations in which the magnet 10 is connected to a positive supply terminal through the material of the cryogen vessel, while a negative current lead, similar to feature 21 shown in the drawings, may provide connection between the magnet and a negative supply terminal. Furthermore, the present invention may employ a tubular structure similar to that illustrated at 21 in the drawings but which is not used as a current lead at all.

Quench valve 32 may be replaced by any suitable pressure limiting device, for example a simple burst disc.

Although modifications and changes may be suggested by those skilled in the art, it is the intention of the inventors to embody within the patent warranted heron all changes and modifications as reasonably and properly come within the scope of their contribution to the art.

We claim as our invention:

1. An over-pressure limiting arrangement for a cryogen vessel comprising:
    an access neck for providing that provides access into a cryogen vessel at its lower extremity;
    a tubular structure extending through the access neck;
    a turret outer assembly joined to the cryogen vessel in a leak-tight manner and defining an interior volume which is separated from atmosphere by a protective valve or burst disc, the interior volume enclosing upper extremities of the access neck and the tubular structure;
    an egress path defining a route for cryogen gas to escape from the interior volume of the turret outer assembly; and
    a pressure limiting device sealing the egress path from the interior volume of the turret outer assembly, operable to open in response to a differential pressure between the interior volume of the turret outer assembly and the interior of the egress path exceeding a predetermined value; characterized in that the over-pressure limiting arrangement further comprises an auxiliary burst disc assembly attached to the tubular structure, such that an inner surface of an auxiliary burst disc of the auxiliary burst disc assembly is exposed to the interior of the tubular structure, and an outer surface of the auxiliary burst disc is exposed to the interior volume of the turret outer assembly.

2. The over-pressure limiting arrangement according to claim 1 wherein the auxiliary burst disc assembly is located within the turret outer assembly.

3. The over-pressure limiting arrangement according to claim 1 wherein the auxiliary burst disc assembly is located within the tubular structure.

4. The over-pressure limiting arrangement according to claim 1 wherein the tubular structure forms a current lead that carries electric current to or from a superconducting magnet arranged within a cryogen vessel.

5. The over-pressure limiting arrangement according to claim 1 wherein the auxiliary burst disc is mounted onto a carrier which is itself mounted by pillars onto a removable cover plate.

6. The over-pressure limiting arrangement according to claim 5 wherein the removable cover plate seals a port in a service entry plate, part of the structure of the turret outer assembly.

7. The over-pressure limiting arrangement according to claim 5 comprising a sight glass situated in the removable cover plate, directly above the auxiliary burst disc.

8. The over-pressure limiting arrangement according to claim 1, comprising a tube connected to the auxiliary burst disc, said tube passes passing inside the tubular structure.

9. The over-pressure limiting arrangement according to claim 8, comprising a carrier to which the tube is bonded, said carrier carrying the auxiliary burst disc.

10. The over-pressure limiting arrangement according to claim 8, comprising a burst disc carrier that carries the auxiliary burst disc and the tube, said burst disc carrier being sealed to an upper extremity of the tubular structure.

11. An over-pressure limiting arrangement for a cryogen vessel comprising:
    an access neck that provides access in to a cryogen vessel at a lower extremity of said access neck;
    a tubular structure extending through the access neck;
    a turret outer assembly joined to the cryogen vessel in a leak-tight manner and defining an interior volume which is separated from atmosphere by a protective valve or burst disc, the interior volume enclosing upper extremities of the access neck and the tubular structure;
    an egress path defining a route for cryogen gas to escape from the interior volume of the turret outer assembly;
    a pressure limiting device sealing the egress path from the interior volume of the turret outer assembly, operable to open in response to a differential pressure between the interior of the turret outer assembly and the interior of the egress path exceeding a predetermined value; and
    a valve attached to the tubular structure, such that an inner surface of the valve is exposed to the interior of the tubular structure, and an outer surface of the valve is exposed to the interior volume of the turret outer assembly.

12. The over-pressure limiting arrangement according to claim 11 wherein the valve is located within the turret outer assembly.

13. The over-pressure limiting arrangement according to claim 11 wherein the valve is located at an upper extremity of the tubular structure.

14. The over-pressure limiting arrangement according to claim 11 wherein the tubular structure forms a current lead that carries electric current to or from a superconducting magnet arranged within a cryogen vessel.

15. The over-pressure limiting arrangement according to claim 11 comprising a carrier to the valve is mounted, said carrier being mounted by pillars onto a removable cover plate.

16. The over-pressure limiting arrangement according to claim 15 wherein the removable cover plate seals a port in a service entry plate, part of the structure of the turret outer assembly.

17. The over-pressure limiting arrangement according to claim 15 wherein a sight glass is situated in the removable cover plate, directly above the valve.

18. The over-pressure limiting arrangement according to claim 11 comprising a tube to which the valve is mounted, said tube passing inside the tubular structure.

19. The over-pressure limiting arrangement according to claim 18 wherein the tube is bonded to the valve.

* * * * *